United States Patent [19]

Nakano et al.

[11] Patent Number: 5,049,367
[45] Date of Patent: Sep. 17, 1991

[54] ALUMINUM NITRIDE POWDER AND PROCESS FOR PREPARATION OF THE SAME

[75] Inventors: Kazuhiko Nakano, Ibaraki; Mitsutoshi Murase, Ehime; Norio Matsuda, Ibaraki; Hideaki Murakami, Ehime, all of Japan

[73] Assignee: Sumitomo Chemical Co., Ltd., Osaka, Japan

[21] Appl. No.: 417,104

[22] Filed: Oct. 4, 1989

[30] Foreign Application Priority Data

Oct. 5, 1988 [JP] Japan ................. 63-252774
Oct. 5, 1988 [JP] Japan ................. 63-252775

[51] Int. Cl.$^5$ .............. C01B 21/072; C04B 35/58
[52] U.S. Cl. ........................... 423/412; 501/96
[58] Field of Search ........................... 423/412

[56] References Cited

U.S. PATENT DOCUMENTS

| | | |
|---|---|---|
| 2,962,359 | 11/1960 | Perieres et al. ............ 423/412 |
| 3,397,958 | 8/1968 | Perieres et al. ............ 423/412 |
| 4,533,645 | 8/1985 | Huseby et al. ............ 423/412 |
| 4,618,592 | 10/1986 | Kuramoto et al. ............ 423/412 |
| 4,784,839 | 11/1988 | Bachelard et al. ............ 423/412 |
| 4,851,207 | 7/1989 | Ichikawa et al. ............ 423/412 |

FOREIGN PATENT DOCUMENTS

| | | |
|---|---|---|
| 176737 | 4/1986 | European Pat. Off. |
| 1106296 | 5/1961 | Fed. Rep. of Germany ...... 423/412 |
| 1519473 | 9/1962 | France ................. 423/412 |
| 77111 | 5/1985 | Japan ................. 423/412 |
| 207703 | 9/1987 | Japan ................. 423/412 |
| 107806 | 5/1988 | Japan ................. 423/412 |
| 151604 | 6/1988 | Japan ................. 423/412 |
| 210004 | 8/1988 | Japan ................. 423/412 |
| 2127390 | 4/1984 | United Kingdom . |

OTHER PUBLICATIONS

Silverman, "Carbothermal Synthesis of Aluminum Nitride", Advanced Ceramic Materials, vol. 3, No. 4, Jul. 1988, pp. 418-419.
Chemical Abstracts, vol. 108, No. 12, Mar. 1988, Ref. No. 97244.
Chemical Abstracts, vol. 108, No. 16, Apr. 18, 1988, Ref. No. 136540g.

*Primary Examiner*—Wayne A. Langel
*Attorney, Agent, or Firm*—Sughrue, Mion, Zinn, Macpeak & Seas

[57] ABSTRACT

An aluminum nitride powder obtained by firing and reacting a mixture of alumina and carbon in a nitrogen-containing atmosphere is disclosed, the aluminum nitride powder having an oxygen content of not more than 2.0% by weight, an iron content of not more than 20 ppm, a silicon content of not more than 100 ppm, and a titanium content of not more than 20 ppm and having has a tapped density of at least 1.0 g/cm$^3$. An aluminum nitride powder containing from 0.01% to 10% by weight of a sintering aid is also disclosed, the aluminum nitride powder having an oleophilic surface and having a tapped density of at least 1.0 g/cm$^3$. The aluminum nitride powder of the present invention has excellent moldability, has a high tapped density, is less in formation of coagulated particles, and has a sharp particle size distribution.

11 Claims, No Drawings

ALUMINUM NITRIDE POWDER AND PROCESS FOR PREPARATION OF THE SAME

FIELD OF THE INVENTION

The present invention relates to an aluminum nitride powder with excellent moldability, which has a high tapped density, is less in formation of coagulated particles, and which has a sharp particle size distribution and a process for preparation of the same.

BACKGROUND OF THE INVENTION

Alumina has hitherto been used as an IC packaging material or substrate material. However, with the increasing integration, speed and output power of, e.g., LSI, it has become necessary to efficiently dissipate heat generated in a chip out of the system, and materials which have higher thermal conductivity and more excellent heat dissipation than alumina are being demanded.

Since aluminum nitride not only has high thermal conductivity but is excellent in electrical characteristics such as insulation resistance, dielectric strength and dielectric constant and mechanical characteristics such as strength, it is now attracting special attention as a packaging material or substrate material best adapted for heat dissipation.

As the process for preparation of an aluminum nitride powder, there have hitherto been known the following two nitriding methods: (1) a direct nitriding method for nitriding a metallic aluminum powder upon heating in a nitrogen-containing atmosphere, and (2) a reductive nitriding method for heating a mixture of alumina or alumina hydrate and carbon in a nitrogen-containing atmosphere. Though the aluminum nitride powder obtained in the former method is a readily moldable powder having a high tapped density, it contains relatively high amounts of cation impurities such as iron and, hence, it is not always satisfactory in order to obtain a sintered body having high thermal conductivity. Accordingly, the aluminum nitride powder synthesized by the latter reductive nitriding method is most likely to be a powder for obtaining high thermal conductivity substrates. However, though the aluminum nitride powder obtained by the reductive nitriding method has such an advantage that the amounts of oxygen and cation impurities such as iron are low, it has a low tapped density so that it is difficult to mold.

In addition, the aluminum nitride powder is readily hydrolyzable and involves a problem that a special attention should be paid for storage or handling. Moreover, since the surface of the aluminum nitride powder is usually oxidized or hydrolyzed whereby it is covered by a very thin oxide film layer, even when the aluminum nitride powder is sintered under atmospheric pressure as it is, a high thermal conductivity sintered body cannot be obtained. Therefore, the aluminum nitride powder is usually sintered upon addition of a compound such as calcium carbonate, strontium carbonate, or yttrium oxide, whereby a high thermal conductivity sintered material is obtained. However, this method involves a problem that it is not easy to uniformly mix and disperse such an added compound because the surface characteristics of the aluminum nitride powder are not always identical to those of the compound added.

Furthermore, the aluminum nitride powder is so bulky that if the tapped density is low, it is hard to not only disperse it in a solvent but also obtain a highly dense molded article therefrom. Thus, the degree of shrinkage is high during sintering, and a sintered material with good dimensional precision can hardly be obtained. Still further, if the mixing and dispersion of the aluminum nitride powder and additive powder are insufficient and the homogeniety is poor, the sintering is unlikely to proceed uniformly so that the shrinkage during the sintering is not uniform, resulting in easy formation of warpage of a sintered body or anisotropy of the shrinkage.

SUMMARY OF THE INVENTION

The present invention is intended to solve the defects which the powder obtained by the reductive nitriding method involves and relates to an aluminum powder with excellent moldability, which contains small amounts of cation impurities, has a high tapped density, is less in formation of coagulated particles, and which has a sharp particle size distribution, and a process for preparation of the same.

That is, a first object of the present invention is to provide an aluminum nitride powder obtained by firing and reacting a mixture of alumina and carbon in a nitrogen-containing atmosphere, which has an oxygen content of not more than 2.0% by weight, an iron content of not more than 20 ppm, a silicon content of not more than 100 ppm, and a titanium content of not more than 20 ppm and which has a tapped density of at least 1.0 g/cm$^3$.

A second object of the present invention is to provide an aluminum nitride powder comprising an aluminum nitride powder and from 0.01 to 10% by weight of a sintering aid, which has an oleophilic surface and which has a tapped density of at least 1.0 g/cm$^3$.

A third object of the present invention is to provide a process for preparation of an aluminum nitride powder comprising pulverizing a reaction product obtained by firing a mixture of an alumina powder and a carbon powder in a nitrogen-containing atmosphere, and then calcining the reaction product in air to remove an excess carbon powder.

A fourth object of the present invention is to provide a process for preparation of an aluminum nitride powder comprising pulverizing a reaction product obtained by firing a mixture of an alumina power and a carbon powder in a nitrogen-containing atmosphere, calcining the reaction product in air to remove an excess carbon powder, and then pulverizing the residue.

A fifth object of the present invention is to provide a process for preparation of an aluminum nitride powder comprising subjecting an aluminum nitride powder obtained by a reductive nitriding method to a dry contact treatment together with from 0.01 to 10% by weight of a sintering aid and from 0.05 to 2.0% by weight of a dispersing agent containing therein an oleophilic group.

DETAILED DESCRIPTION OF THE INVENTION

The aluminum nitride powder according to the present invention is hereunder described in detail.

It is known that the presence of oxygen, iron, silicon and titanium contained in a raw material powder for the preparation of the aluminum nitride powder likely reduces the thermal conductivity of a sintered body obtained by use of this raw material powder. Such a tendency is more likely observed as the content of these impurities increases. Accordingly, in order to stably attain a high thermal conductivity of at least 180 W/mK through sintering by using yttrium oxide as a sintering aid, it is required that the foregoing impurities be not present in amounts exceeding certain limits. In accordance with a reductive nitriding method, it is easy to synthesize a high-purity powder having an oxygen content of not more than 2.0% by weight, an iron content of not more than 20 ppm, a silicon content of not more than 100 ppm and a titanium content of not more than 20 ppm. However, it is the present status that according to the conventional reductive nitriding method, only a powder having a tapped density of at most about 0.8 g/cm$^3$ is obtainable. The present invention is to provide a high-purity aluminum nitride powder having a tapped density of at least 1.0 g/cm$^3$. If the tapped density is too low, the tightness during the molding is not satisfactory so that a highly dense molded article can hardly be obtained. Further, the degree of shrinkage during the sintering increases so that a sintered body having good dimensional precision can hardly be obtained. Still further, there is a problem that in adding the aluminum nitride powder as a highly thermal conductive filler to a high molecular weight material such as rubbers or resins, the filling properties are inferior. In particular, if the tapped density is less than 1.0 g/cm$^3$, for example, it is impossible to contain 20 kg of such a powder in a 20-liter vessel so that a special vessel is required.

The oleophilicity of the aluminum nitride powder can be imparted by introducing oleophilic groups into the surface thereof. While the method for introducing oleophilic groups into the surface of the aluminum nitride powder will be described later in detail, it can be done by subjecting the aluminum nitride powder to a wet or dry contact treatment together with from 0.01 to 10% by weight of a sintering aid and a dispersing agent containing therein an oleophilic group. When such oleophilic groups are introduced into the surface of the aluminum nitride powder, the water resistance and hydrolysis resistance of the aluminum nitride powder are markedly improved.

In addition, if the tapped density of the aluminum nitride powder is at least 1.0 g/cm$^3$, it becomes easy to obtain a highly dense molded article. As a result, the degree of shrinkage during the sintering becomes low so that a sintered body having good dimensional precision can be readily obtained.

Then, the preparation processes according to the present invention are described.

First of all, an aluminum nitride powder is synthesized by reacting a mixture of an alumina powder and a carbon powder in a nitrogen-containing atmosphere at from 1,500° to 1,700° C. for from 2 to 10 hours in the reductive nitriding method.

As the alumina powder which is used as one of the staring materials in the present invention, not only those produced by the Bayer method, which are most commerically available, but also those produced by various other methods can be used. The alumina powder preferably has an average particle diameter of not more than 5 μm and more preferably not more than 3 μm. However, it is preferred to use an alumina powder having low contents of metal impurities which are hardly volatile during the reductive nitriding reaction, such as silicon and titanium.

Further, it is preferred that the carbon powder which is another starting material used in the present invention is a fine powder having a purity as high as possible.

More preferably, the carbon powder has a particle diameter of primary particle of not more than 1 μm and an ash content of not more than 0.3% by weight. Examples of the carbon powder which can be used include acetylene black, channel black, and furnace black. Among them is preferred acetylene black from the viewpoint of high purity. Further, if the dispersion is readily achieved, it is advantageous to use those which have been granulated to a size of from 0.3 to 1.5 mm or those which have been compressed in a powder state from the viewpoint of handling.

As the method for mixing and dispersing the alumina powder and carbon powder, there are employable usual methods such as a ultrasonic dispersion method as well as those using various mixing apparatus such as a ball mill and a vertical granulator. It is desired that parts of such apparatus which are brought into direct contact with the starting materials are constructed from a material into which metal impurities are not incorporated. As such a material, synthetic resins such as polyethylene, nylon and polyurethane, natural or synthetic rubbers, and alumina or aluminum nitride can be suitably used. Also, those lined or coated with the foregoing materials are suitable.

As the method for drying the mixture, usual industrial methods can be employed. However, if the slurry concentration during the mixing is low, resulting in likely causing, for example, separation of the alumina powder from the carbon powder during the drying, it is preferred to employ spray drying, freeze drying, or a method using a rotary evaporator. Further, if desired, in addition the mixing and drying, granulation of the particles to a size of from about 20 μm to 3 mm can be carried out. In this case, there is an advantage from the viewpoint of easiness in handling during the subsequent operations.

In order to likely complete the reductive nitriding reaction, the amount of the carbon powder which is reacted is usually at least equivalent to that of the alumina powder which is also reacted. A mixing ratio of the alumina powder and carbon powder is preferably from 3 to 10 and more preferably from 3.2 to 7 in terms of a carbon/alumina molar ratio. If the molar ratio is less than 3, unreacted alumina remains. On the other hand, if it exceeds 10, not only it is difficult to remove the carbon in the subsequent stage, but such is not preferred from the economical viewpoint. Accordingly, the reaction product obtained by the reductive nitriding reaction is usually a mixture of the aluminum nitride powder and excess carbon powder. This mixture is fired in dry air at from 600° to 750° C. to calcine and remove the excess carbon, whereby an aluminum nitride powder is obtained.

The aluminum nitride powder obtained by these steps is a powder containing small amounts of coagulated particles and having a low tapped density.

In one embodiment of the present invention, the mixture of the aluminum nitride powder and excessive carbon powder obtained by the above-described reductive nitriding reaction is pulverized and then fired in air at from 600° to 750° C. to calcine and remove the excess carbon, whereby an aluminum nitride powder having a high tapped density, which is less in formation of coagulated particles, is obtained.

In another embodiment of the present invention, the mixture of the aluminum nitride powder and excessive carbon powder obtained by the above-described reductive nitriding reaction is fired in air at from 600° to 750°

C. to calcine and remove the excess carbon and then pulverized, whereby an aluminum nitride powder having a high tapped density, which is less in formation of coagulated particles, is obtained.

For achieving the pulverizing in these two embodiments, usual mills such as a ball mill, a vibrating mill, and a jet mill can be used. However, the aluminum nitride powder is readily hydrolyzable so that its oxygen content tends to increase during the pulverizing stage. Further, if a BET specific surface area increases due to the pulverizing, or the content of fine powders having a size of less than 1 μm increases, the surface of the aluminum nitride powder is likely oxidized, resulting in an increase in oxygen content. Accordingly, the pulverizing must be carried out such that the BET specific surface area be not more than 6 m²/g and that the content of fine powders having a size of less than 1 μm be not more than 50% and preferably not more than 30%.

Further, the pulverizing is preferably carried out in dyr air or a dry nitrogen gas for a period of time as short as possible. Usually, the pulverizing is preferably carried out in dry air or a dry nitrogen gas for a period of time as short as possible by the addition of a suitable amount of a pulverizing aid such as methanol, oleic acid, lauric acid, calcium stearate, and arylalkyl sulfones for increasing the pulverizing efficiency. Moreover, since contamination is caused by metal impurities such as iron and silicon depending on the materials for the pulverizing apparatus and pulverizing medium, it is preferred to use those made of aluminum nitride or alumina or those lined or coated with plastics or rubbers.

In a still another embodiment of the present invention, the aluminum nitride powder obtained by the above-described reductive nitriding reaction is added with from 0.01 to 10% by weight of a sintering aid and further with from 0.05 to 2.0% by weight of a dispersing agent containing therein an oleophilic group to effect a dry contact treatment, whereby an aluminum nitride powder containing from 0.5 to 10% by weight of the sintering aid, having an oleophilic surface, and having a tapped density of at least 1.0 g/cm³ is obtained.

The aluminum nitride powder used herein is one obtained by the above-described reductive nitriding reaction but preferably has an oxygen content of not more than 2.0% by weight, an iron content of not more than 80 ppm, a silicon content of not more than 150 ppm and a titanium content of not more than 30 ppm, from the standpoint of obtaining a high thermal conductivity sintered body.

As the sintering aid, any of those which have been proposed can be used without specific limitations. Preferably, one or more of alkaline earth metal compounds, yttrium compounds and rare earth metal compounds can be used. Most preferably, one or more compounds selected from calcium carbonate, strontium carbonate, and yttrium oxide can be used. A suitable amount of the sintering aid used is in the range of from 0.01 to 10% by weight. If the amount is less than 0.01% by weight, no effects for improving the sintering properties and thermal conductivity of a sintered body are seen. On the other hand, if the amount exceeds 10% by weight, though an effect for improving the sintering properties reveals, a high amount of the sintering aid component remains in the sintered body so that a high thermal conductivity sintered body cannot be obtained. Further, the sintering aid preferably has an average particle diameter of not more than 3 μm.

Examples of the dispersing agent containing therein an oleophilic group which can be used in the present invention include higher fatty acids containing from 10 to 18 carbon atoms, such as decanoic acid, dodecanoic acid, and oleic acid, and salts thereof (the term "salt of acid" referred to herein means a salt of ammonium, Na, K, Mg, Ca, Sr, Al, or Y); sulfuric acid ester salts of higher alcohols containing from 10 to 18 carbon atoms, such as decyl sulfate and dodecyl sulfate; alkylarylsulfonic acid ester salts in which the alkyl moiety thereof contains from 10 to 18 carbon atoms, and the aryl moiety thereof contains 6 or 12 carbon atoms, such as dodecylbenzenesulfonic acid; dialkylsulfosuccinic acid salts in which the alkyl moiety thereof contains from 4 to 12 carbon atoms, such as di-2-ethylhexylsulfosuccinate; polyoxyethylene alkylsulfuric acid ethers in which the alkyl moiety thereof contains from 10 to 18 carbon atoms, and the molar number of ethylene oxide added is from 7 to 13, such as polyoxyethylene decyl ether sulfuric acid salt; polyoxyethylene higher alcohol ethers in which the alcohol moiety thereof contains from 10 to 18 carbon atoms, and the molar number of ethylene oxide added is from 7 to 13, such as polyoxyethylene decyl ether; polyoxyethylene alkylphenol ethers in which the alkyl moiety thereof contains from 8 to 18 carbon atoms, and the molar number of ethylene oxide added is from 7 to 13, such as polyoxyethylene octylphenol ether; sorbitan higher fatty acid esters in which the higher fatty acid moiety thereof contains from 10 to 18 carbon atoms, such as sorbitan decanate and sorbitan oleate; polyoxyethylene sorbitan fatty acid esters in which the higher fatty acid moiety thereof contains from 10 to 18 carbon atoms, and the molar number of ethylene oxide added is from 7 to 13, such as polyoxyethylene sorbitan decanate and polyoxyethylene sorbitan oleate; polyoxyethylene higher fatty acid esters in which the higher fatty acid moiety thereof contains from 10 to 18 carbon atoms, and the molar number of ethylene oxide is from 7 to 13, such as polyoxyethylene decanate; glycerin higher fatty acid esters in which the higher fatty acid moiety thereof contains from 10 to 18 carbon atoms, such as dodecanoic acid glyceride, octadecanoic acid glyceride, and oleic acid glyceride; higher alkylamine acetic acid salts in which the alkyl moiety thereof contains from 10 to 18 carbon atoms, such as decylamine acetate; polyoxyethylene alkylamines in which the alkyl moiety thereof contains from 10 to 18 carbon atoms, and the molar number of ethylene oxide added is from 7 to 13, such as polyoxyethylene decylamine; phosphoric acid esters of a $C_{10}$–$C_{18}$ higher fatty acid, such as lecithin; and organoaluminum coupling agents such as acetoalkoxyaluminum diisopropylates. These compounds can be used alone or in admixture. The dispersing agent containing therein an oleophilic group can be used as it is or in the state dissolved or dispersed in a suitable solvent.

Though the amount of the dispersing agent containing therein an oleophilic group varies depending on the surface area of the aluminum nitride powder used or the nature of the dispersing agent, it is suitably in the range of from 0.05 to 2.0% by weight. If the amount is less than 0.05% by weight, an effect for rendering the surface of the aluminum nitride powder oleophilic does not substantially result. On the other hand, if it exceeds 2.0% by weight, not only the surface of the aluminum nitride powder is tacky, but such is not economically preferred.

As the method for introducing oleophilic groups, it is preferred to choose a dry contact treatment method in which the foregoing dispersing agent containing therein an oleophilic group or a solution thereof is added to the aluminum nitride powder and sintering aid, followed by mixing and pulverizing in a ball mill or the like. Though the oleophilic groups can be introduced by a wet contact treatment method in which the aluminum nitride powder and sintering aid are dispersed in a solution of the dispersing agent containing therein an oleophilic group, since this method requires a drying step, it is not always an economically suitable method. Further, according to this wet method, it is difficult to obtain a powder having a high tapped density.

The dry contact treatment method can be carried out by means of an apparatus used for the usual decoagulating or pulverizing, such as a ball mill, a vibrating mill, and a jet mill. However, since the aluminum nitride powder is readily hydrolyzable its oxygen content tends to increase during the dry contact treatment stage. Accordingly, the dry contact treatment is preferably carried out in dry air or a dry nitrogen gas for a period of time as short as possible. Moreover, since contamination by metal impurities such as iron and silicon is caused depending on the materials for the pulverizing apparatus and pulverizing medium, it is preferred to use those made of aluminum nitride or alumina or those lined or coated with plastics or rubbers.

The aluminum nitride powder obtained in the present invention is a powder which has low contents of oxygen, iron, silicon and titanium, is less in formation of coagulated particles, has a high tapped density, and which is excellent in moldability. When this powder is used, not only the degree of shrinkage during the sintering can be reduced, but also a highly dense sintered body which does not substantially contain pores and which has a high thermal conductivity can be readily obtained.

Further, according to the present invention, when the aluminum nitride powder is brought into contact with a dispersing agent containing therein an oleophilic group in the presence of a dry sintering aid, an aluminum nitride powder with good dispersion between the aluminum nitride powder and the sintering aid can be obtained. The resulting aluminum nitride powder is a readily sintering aluminum nitride powder having an oleophilic surface, which is substantially freed of formation of coagulated particles, has a high tapped density, and which is excellent in hydrolysis resistance and moldability. When this powder is used, not only can the degree of shrinkage during the sintering be reduced, but also a highly dense sintered body which does not substantially contain pores and which has a high thermal conductivity can be readily obtained.

Accordingly, the present invention can provide a starting material useful for production of high thermal conductivity aluminum nitride sintered bodies.

The present invention is hereunder described specifically with reference to Examples and Comparative Examples. However, it is not to be construed that the invention is limited thereto.

EXAMPLE 1

2600 g of ion exchange water having dissolved therein 306 g of a low-sodium content alumina powder (purity: 99.9%, an average particle diameter measured by sedigraph: 0.7 $\mu$m, content of particles having a particle diameter of not more than 1 $\mu$m: 80%), 216 g of a 100% pressed product of acetylene black having an ash content of 0.005%, 11.3 g of aluminum nitrate [Al(NO$_3$)$_3$·9H$_2$O], 5.2 g of polyethylene glycol, and 15.1 g of a nonionic surfactant comprising polyoxyethylene alkylphenyl ethers (Noigen ® EA137, a trade name of Dai-ichi Kogyo Seiyaku Co., Ltd.) was charged in a polyethylene-made pot together with 600 pieces of nylon balls having a diameter of 15 mm and wet mixed at a revolution rate of 40 rpm for 10 hours.

The thus obtained mixed slurry was dried in a dryer. 500 g of the dried slurry was weighed on a graphite-made tray and subjected to reductive nitriding reaction upon firing at 1,580° C. for 7 hours while flowing a nitrogen gas at a rate of 200 cm/min in an electric furnace. Thereafter, 150 g of the reaction product was taken into a 2-liter polyethylene-made pot, and 2.5 kg of alumina-made balls having a diameter of 15 mm and 1.5 g of lauric acid were added thereto. After thoroughly purging the pot with a nitrogen gas, the mixture was subjected to dry ball mill pulverizing at a revolution rate of 60 rpm for 3 hours. The pulverized material was further fired in dry air at 700° C. for 3 hours to calcine and remove exceesive carbon, whereby an aluminum nitride powder was obtained. Various physical properties of this aluminum nitride powder are shown in Table 1. This powder was a high-purity fine particle which is substantially freed of the formation of coagulated particles and which has a sharp particle size distribution.

The measurements of oxygen content, metal ion content, particle size distribution, and bulk density and tapped density were carried out by the impulse heat infrared absorption method (Model TC-436 of an oxygen-nitrogen simultaneous analysis apparatus manufactured by LECO Corp.), the ICP emission spectroscopic analysis method (Quantolet GQM-75 manufactured by Shimadzu Corporation), the sedigraph (Sedi Graph 5000ET manufactured by Micromeritics Corp.), and the method according to JIS H-1902, respectively. The respective measurements in the following Examples and Comparative Examples were carried out in the same manners as those described above.

To this powder were added as sintering aids 1% by weight, calculated as CaO, of calcium carbonate and 3% by weight, calculated as CaO, of yttrium oxide, and the mixture was press molded under a pressure of 1,500 kg/cm$^2$ to give a molded article. The molded article was embedded in a mixed powder of aluminum nitride and boron nitride and sintered at 1,850° C. for 3 hours under atmospheric pressure. The molded article had a high relative density as 58.5% and showed a low degree of shrinkage as 16% during the sintering. Further, the resulting sintered body was a pore-free sintered body and showed a high thermal conductivity as 200 W/mK.

The measurement of the thermal conductivity was carried out by the laser flash method (Model TC-7000 manufactured by Shinku Riko K.K.). The measurement of the thermal conductivity in the following Examples and Comparative Examples was carried out in the same manner as that described above.

EXAMPLE 2

A reaction product of an aluminum nitride powder and a carbon powder was obtained by undergoing the same reductive nitriding reaction as in Example 1, except that a usual alumina powder obtained by the Bayer method (purity: 99.7%, an average particle diameter:

0.6 μm, content of particles having a particle diameter of not more than 1 μm: 80%) was used as the alumina starting material. Thereafter, this reaction product was fired in dry air at 700° C. for 3 hours to calcine and remove excessive carbon, whereby an aluminum nitride powder was obtained. 150 g of this aluminum nitride powder was taken into a 2-liter polyethylene-made pot, and 2.5 kg of alumina-made balls having a diameter of 15 mm and 1.5 g of methanol were added thereto. After thoroughly purging the pot with dry air, the mixture was subjected to dry ball mill pulverizing at a revolution of 60 rpm for 3 hours.

Various physical properties of this aluminum nitride powder are shown in Table 1. This powder was a high-purity fine powder which is substantially freed of the formation of coagulated particles and which has a sharp particle size distribution.

The resulting powder was molded and sintered in the same manner as in Example 1, to form a molded article. The molded article had a high relative density as 59% and showed a low degree of shrinkage as 16% during the sintering. Further, the resulting sintered body showed a high thermal conductivity as 205 W/mK.

COMPARATIVE EXAMPLE 1

2600 g of ion exchange water having dissolved therein 306 g of a low-sodium content alumina powder (purity: 99.9%, an average particle diameter measured by sedigraph: 0.7 μm, content of particles having a particle diameter of not more than 1 μm: 80%), 216 g of a 100% pressed product of acetylene black having an ash content of 0.005%, 11.3 g of aluminum nitrate [Al(NO$_3$)$_3$·9H$_2$O], 5.2 g of polyethylene glycol, and 15.1 g of a nonionic surfactant comprising polyoxyethylene alkylphenyl ethers (Noigen ® EA137, a trade name of Dai-ichi Kogyo Seiyaku Co., Ltd.) was charged in a polyethylene-made pot together with 600 pieces of nylon balls having a diameter of 15 mm and wet mixed at a revolution rate of 40 rpm for 10 hours.

The thus obtained mixed slurry was dried in a dryer. 500 g of the dried slurry was weighed on a graphite-made tray and subjected to reductive nitriding reaction upon firing at 1,580° C. for 7 hours while flowing a nitrogen gas at a rate of 200 cm/min in an electric furnace. This reaction product was then fired in dry air at 700° C. for 3 hours to calcine and remove excessive carbon, whereby an aluminum nitride powder was obtained. Various physical properties of this aluminum nitride powder are shown in Table 1. This powder was a high-purity fine powder in which coaguated particles were slightly present.

The resulting powder was molded and sintered in the same manner as in Example 1, to form a molded article. The molded article had a relative density as 52% and showed a high degree of shrinkage as 20% during the sintering. Further, the resulting sintered body showed a high thermal conductivity as 195 W/mK.

TABLE 1

|  | Example 1 | Example 2 | Comparative Example 1 |
| --- | --- | --- | --- |
| Oxygen content (%) | 1.3 | 1.2 | 1.3 |
| Iron content (ppm) | 8 | 9 | 8 |
| Silicon content (ppm) | 56 | 36 | 52 |
| Titanium content (ppm) | 13 | 14 | 13 |
| Average diameter (μm) | 1.3 | 1.4 | 1.7 |
| Content of particles of greater than 2 μm (%) | 15 | 14 | 42 |
| Content of particles of | 13 | 14 | 12 |

TABLE 1-continued

|  | Example 1 | Example 2 | Comparative Example 1 |
| --- | --- | --- | --- |
| smaller than 1 μm (%) |  |  |  |
| Bulk density (g/cm$^3$) | 0.6 | 0.6 | 0.3 |
| Tapped density (g/cm$^3$) | 1.2 | 1.5 | 0.6 |

EXAMPLE 3

The reaction product obtained by the reductive nitriding reaction in Example 1 was fired in dry air at 700° C. for 3 hours to calcine and remove excessive carbon, whereby an aluminum nitride powder (a) was obtained.

Various physical properties of this aluminum nitride powder are shown in Table 2. This aluminum nitride powder was a high-purity fine powder which is relatively low in formation of coagulated particles.

Then, 150 g of this powder and, as sintering aids, 2 g of a calcium carbonate powder and 4.5 g of an yttrium oxide powder were taken into a 2-liter polyethylene-made pot, and 2.5 kg of alumina-made balls having a diameter of 15 mm and, as a dispersing agent containing therein an oleophilic group, 1.5 g of oleic acid were added thereto. After thoroughly purging the pot with dry air, the mixture was subjected to dry ball mill pulverizing at a revolution rate of 60 rpm for 3 hours. Various physical properties of the resulting powder are shown in Table 2. This powder was a fine powder which is substantially freed of the formation of coagulated particles and which has a sharp partilce size distribution. Further, this powder was not at all compatible with water. Then, this powder was dispersed in an aqueous solution of a nonionic surfactant (Tween ® 60, a product of Nakarai Chemical Co., Ltd.), and its hydrolyzability was examined. As the result, even after immersing for 90 days, the pH value did not change from the initial value of 6.1 so that it had remarkably improved hydrolysis resistance.

Further, this powder was press moled at 1,500 kg/cm$^2$ to form a molded article which was then embedded in a mixed powder of aluminum nitride and boron nitride and sintered in a nitrogen atmosphere at 1,900° C. for 3 hours under atmospheric pressure. The molded article had a high relative density as 58.5% and showed a low degree of shrinkage as 16% during the sintering. Further, the resulting sintered body was a pore-free sintered body and showed a high thermal conductivity as 200 W/mK.

EXAMPLE 4

The reaction product obtained by the reductive nitriding reaction in Example 2 was fired in dry air at 700° C. for 3 hours to calcine and remove excessive carbon, whereby an aluminum nitride powder (b) was obtained.

Various physical properties of this aluminum nitride powder are shown in Table 2. This aluminum nitride powder was a high-purity fine powder which is relatively low in formation of coagulated particles.

This powder was subjected to a dry contact treatment by means of a ball mill together with the sintering aids and dispersing agent containing therein an oleophilic group in the same manner as in Example 3. Various physical properties of the resulting powder are shown in Table 3. This powder was a fine powder which is substantially freed of the formation of coagulated particles and which has a sharp particle size distribution. Further, this powder was not at all compatible with water. Then, this powder was dispersed in an aqueous solution containing the same surfactant as in Example 3 to examine its hydrolyzability. As the result, even after immersing for 90 days, the pH value of the aqueous solution did not change from the initial value of 5.9 so that it had remarkably improved hydrolysis resistance.

Further, the resulting powder was molded and sintered in the same manner as in Example 1. The resulting molded article had a high relative density as 59% and showed a low degree of shrinkage as 16% during the sintering. The sintered body showed a high thermal conductivity as 205 W/mK.

COMPARATIVE EXAMPLE 2

2600 g of ion exchange water having dissolved therein 306 g of a low-sodium content alumina powder (purity: 99.9%, an average particle diameter measured by sedigraph: 0.8 μm, content of particles having a particle diameter of not more than 1 μm: 78%), 216 g of a 100% pressed product of acetylene black having an ash content of 0.005%, 11.3 g of aluminum nitrate [Al(NO$_3$)$_3$·9H$_2$O], 5.2 g of polyethylene glycol, and 15.1 g of a nonionic surfactant comprising polyoxyethylene alkylphenyl ethers (Noigen ® EA137, a trade name of Dai-ichi Kogyo Seiyaku Co., Ltd.) was charged in a polyethylene-made pot together with 600 pieces of nylon balls having a diameter of 15 mm and wet mixed at a revolution rate of 40 rpm for 10 hours.

The thus obtained mixed slurry was dried in a dryer. 500 g of the dried slurry was weighed on a graphite-made tray and subjected to reductive nitriding reaction upon firing at 1580° C. for 7 hours while flowing a nitrogen gas at a rate of 200 cm/min in an electric furnace. This reaction product was then fired in dry air at 700° C. for 3 hours to calcine and remove excessive carbon, whereby an aluminum nitride powder was obtained. Various physical properties of this aluminum nitride powder are shown in Table 3. This powder was a high-purity fine powder in which coaguated particles were slightly present. Further, this powder was dispersed in an aqueous solution containing the same surfactant as in Example 3 to examine its hydrolyzability. As the result, after immersing only for one day, the pH of the aqueous solution increased from 5.8 to 10.6 so that hydrolysis likely took place.

The resulting powder was molded and sintered in the same manner as in Example 3. As the result, the molded article had a relative density of 52% and showed a high degree of shrinkage as 20% during the sintering. Further, the sintered body had a thermal conductivity of 75 W/mK.

TABLE 2

|  | Physical Properties of Aluminum Powder | |
| --- | --- | --- |
|  | (a) | (b) |
| Oxygen content (%) | 1.0 | 1.1 |
| Iron content (ppm) | 8 | 9 |
| Silicon content (ppm) | 56 | 40 |
| Titanium content (ppm) | 13 | 13 |
| Average diameter (μm) | 1.8 | 1.8 |
| Content of particles of greater than 2 μm (%) | 43 | 46 |
| Content of particles of smaller than 1 μm (%) | 11 | 10 |
| Bulk density (g/cm$^3$) | 0.3 | 0.3 |
| Tapped density (g/cm$^3$) | 0.6 | 0.6 |

TABLE 3

|  | Example 3 | Example 4 | Comparative Example 2 |
| --- | --- | --- | --- |
| Iron content (ppm) | 9 | 10 | 8 |
| Silicon content (ppm) | 61 | 46 | 52 |
| Titanium content (ppm) | 13 | 14 | 13 |
| CaCO$_3$ content (%) | 1.26 | 1.26 | — |
| Y$_2$O$_3$ content (%) | 2.85 | 2.85 | — |
| Average diameter (μm) | 1.4 | 1.5 | 1.7 |
| Content of particles of greater than 2 μm (%) | 14 | 14 | 42 |
| Content of particles of smaller than 1 μm (%) | 13 | 13 | 12 |
| Bulk density (g/cm$^3$) | 0.6 | 0.6 | 0.3 |
| Tapped density (g/cm$^3$) | 1.4 | 1.5 | 0.6 |

EXAMPLE 5

Each of the aluminum nitride powders (a) and (b) obtained in Examples 3 and 4 was subjected to a dry contact treatment together with the sintering aid and dispersing agent containing therein an oleophilic group as shown in Table 4 in the same manner as in Example 3.

All of the resulting aluminum nitride powders were incompatible with water and exhibited oleophilicity. Various properties of these aluminum nitride powders were evaluated in the same manner as in Example 3, the results of which are shown in Table 4.

100 g of each of the thus obtained aluminum nitride powders was added to 100 ml of an n-butanol solution having dissolved therein 1 g of an acrylic binder (CB-1, a product of Sanyo Chemical Co., Ltd.), followed by mixing and dispersing in a ball mill for 6 hours. After drying, the dispersion was passed through an 80# sieve. The powder which had passed through the sieve was press molded at 1,500 kg/cm$^2$ to form a molded article which was then embedded in a mixed powder of aluminum nitride and boron nitride and sintered in a nitrogen atmosphere at 1,850° C. for 3 hours under atmospheric pressure. The characteristics of the resulting molded articles and sintered bodies are also shown in Table 4.

TABLE 4

|  | Example 5-1 | Example 5-2 | Example 5-3 | Example 5-4 | Example 5-5 |
| --- | --- | --- | --- | --- | --- |
| Aluminum nitride powder | (a) | (b) | (b) | (b) | (b) |
| Dispersing agent | n-Docecanoic acid | Oleic acid glyceride | Oleic acid glyceride | Sorbitan oleate | Stearyl alcohol |
| Sintering aid | Y$_2$O$_3$ | Y$_2$O$_3$ | SrCO$_3$ | CaCO$_3$ | Y$_2$O$_3$ |
| Iron content (ppm) | 11 | 9 | 10 | 10 | 9 |
| Silicon content (ppm) | 68 | 43 | 45 | 48 | 46 |
| Titanium content (ppm) | 14 | 13 | 14 | 13 | 14 |
| Average diameter (μm) | 1.4 | 1.5 | 1.5 | 1.4 | 1.4 |
| Content of particles of greater than 2 μm (%) | 12 | 15 | 15 | 14 | 14 |

TABLE 4-continued

|  | Example 5-1 | Example 5-2 | Example 5-3 | Example 5-4 | Example 5-5 |
| --- | --- | --- | --- | --- | --- |
| Content of particles of smaller than 1 μm (%) | 12 | 13 | 12 | 13 | 12 |
| Bulk density (g/cm$^3$) | 0.6 | 0.6 | 0.6 | 0.6 | 0.6 |
| Tapped density (g/cm$^3$) | 1.5 | 1.5 | 1.4 | 1.4 | 1.5 |
| Density of molded article (%) | 58.8 | 59.1 | 59.2 | 58.9 | 59.2 |
| Degree of shrinkage (%) | 16 | 16 | 16 | 16 | 16 |
| Thermal conductivity (W/mk) | 210 | 220 | 155 | 150 | 225 |

While the invention has been described in detail and with reference to specific embodiments thereof, it will be apparent to one skilled in the art that various changes and modifications can be made therein without departing from the spirit and scope thereof.

What is claimed is:

1. An aluminum nitride powder obtained by firing and reacting a mixture of an alumina powder, wherein the average particle diameter of said alumina as a starting material is not more than 5 μm, and carbon powder in a nitrogen-containing atmosphere, pulverizing said reaction product, and then calcining said reaction product in air to remove an excessive carbon powder, said aluminum nitride powder having an oxygen content of not more than 2.0% by weight, an iron content of not more than 20 ppm, a silicon content of not more than 100 ppm, and a titanium content of not more than 20 ppm and having a tapped density of at least 1.0 g/cm$^3$, having a BET specific surface area of not more than 6 m$^2$/g and having a content of fine powders of less than 1 μm of not more than 50%.

2. An aluminum nitride powder as in claim 1, wherein said carbon is acetylene black.

3. An aluminum nitride powder as in claim 1, wherein said carbon powder is an acetylene black powder.

4. An aluminum nitride powder as in claim 1, wherein said reaction product is a reaction product obtained by reacting a mixture of an alumina powder and a carbon powder in a nitrogen-containing atmosphere at from 1,500° to 1,700° C. for from 2 to 10 hours in the reductive nitriding method.

5. An aluminum nitride powder as in claim 1, wherein the calcination is carried out upon firing in air at from 600° to 750° C.

6. An aluminum nitride powder as in claim 1, wherein the molar ratio of said carbon powder to said alumina powder is from 3 to 10.

7. An aluminum nitride powder obtained by firing and reacting a mixture of alumina powder, wherein the average particle diameter of said alumina as a starting material is not more than 5 μm, and carbon powder in a nitrogen-containing atmosphere, calcining said reaction product in air to remove an excessive carbon powder, pulverizing said aluminum nitride powder, said aluminum nitride powder having an oxygen content of not more than 20 ppm, a silicon content of not more than 20 ppm, having a tapped density of at least 1.0 g/cm$^3$, having a BET specific surface area of not more than 6 m$^2$/g and having a content of fine powders of less than 1 μm of not more than 50%.

8. An aluminum nitride powder as in claim 7, wherein said carbon powder is an acetylene black powder.

9. An aluminum nitride powder as in claim 7, wherein said reaction product is a reaction product obtained by reacting a mixture of an alumina powder and a carbon powder in a nitrogen-containing atmosphere at from 1,500° to 1,700° C. for from 2 to 10 hours in the reductive nitriding method.

10. An aluminum nitride powder as in claim 7, wherein the calcination is carried out upon firing in air at from 600° to 750° C.

11. An aluminum nitride powder as in claim 7, wherein the molar ratio of said carbon powder to said alumina powder is from 3 to 10.

* * * * *